(12) United States Patent  
Li

(10) Patent No.: US 10,937,992 B2
(45) Date of Patent: Mar. 2, 2021

(54) LIGHT EMITTING DEVICE, MANUFACTURING METHOD THEREOF AND DISPLAY DEVICE USING THE SAME

(71) Applicant: GIO Optoelectronics Corp., Tainan (TW)

(72) Inventor: Chin-Tang Li, Tainan (TW)

(73) Assignee: GIO OPTOELECTRONICS CORP., Tainan (TW)

( * ) Notice: Subject to any disclaimer, the term of this patent is extended or adjusted under 35 U.S.C. 154(b) by 15 days.

(21) Appl. No.: 16/169,528

(22) Filed: Oct. 24, 2018

(65) Prior Publication Data

US 2019/0131579 A1     May 2, 2019

Related U.S. Application Data

(60) Provisional application No. 62/578,642, filed on Oct. 30, 2017.

(51) Int. Cl.
| | |
|---|---|
| *H01L 51/52* | (2006.01) |
| *H01L 33/24* | (2010.01) |
| *H01L 33/38* | (2010.01) |
| *H01L 51/00* | (2006.01) |
| *H01L 33/60* | (2010.01) |
| *H01L 33/40* | (2010.01) |

(Continued)

(52) U.S. Cl.
CPC ...... *H01L 51/5271* (2013.01); *H01L 25/0753* (2013.01); *H01L 33/24* (2013.01); *H01L 33/382* (2013.01); *H01L 33/405* (2013.01); *H01L 33/46* (2013.01); *H01L 33/60* (2013.01); *H01L 51/0035* (2013.01); *H01L 51/0042* (2013.01)

(58) Field of Classification Search
CPC .................................................. H01L 33/58–60
See application file for complete search history.

(56) References Cited

U.S. PATENT DOCUMENTS

| | | | |
|---|---|---|---|
| 2009/0180282 A1* | 7/2009 | Aylward | G02B 6/0021 362/245 |
| 2011/0050735 A1* | 3/2011 | Bae | G02B 6/0078 345/690 |

(Continued)

*Primary Examiner* — Jamie C Niesz
(74) *Attorney, Agent, or Firm* — Muncy, Geissler, Olds & Lowe, P.C.

(57) ABSTRACT

A light emitting device, a manufacturing method thereof and a display device are disclosed. The light emitting device includes a light-emitting unit, a structured light guide layer, a light guide unit and a patterned reflective layer. The light-emitting unit has a circuit substrate and multiple light emitting elements, and the light emitting elements are separately disposed on a surface of the circuit substrate. The structured light guide layer is disposed opposite the light-emitting unit, and has multiple accommodating slots and multiple light guide structures disposed between the two accommodating slots. Each accommodating slot is disposed in correspondence with each light emitting element, and the light guide structures are disposed on the bottom surface of the structured light guide layer. The light guide unit is disposed on the top surface of the structured light guide layer. The patterned reflective layer has multiple reflective patterns disposed on the light emitting surface of the light guide unit, and each reflective pattern is disposed in correspondence with each light emitting element.

20 Claims, 5 Drawing Sheets

(51) Int. Cl.
*H01L 33/46* (2010.01)
*H01L 25/075* (2006.01)

(56) References Cited

U.S. PATENT DOCUMENTS

2014/0176863 A1* 6/2014 Oohira ................. G02B 6/0088
                                                                  349/62
2018/0156961 A1* 6/2018 Miki .................... G02B 6/0026

* cited by examiner

LIGHT EMITTING DEVICE, MANUFACTURING METHOD THEREOF AND DISPLAY DEVICE USING THE SAME

CROSS REFERENCE TO RELATED APPLICATIONS

This Non-provisional application claims priority under 35 U.S.C. § 119(a) on U.S. Provisional Application No. 62/578,642, filed on Oct. 30, 2017, the entire contents of which are hereby incorporated by reference.

BACKGROUND OF THE INVENTION

Field of Invention

The invention relates to a light emitting device and a manufacturing method thereof, and more particularly to a light emitting device, a manufacturing method thereof, and a display device having the light emitting device.

Related Art

A light emitting diode (LED), a mini LED or a micro LED (µLED) is a light emitting element manufactured from a semiconductor material, and the element has two electrode terminals, and a voltage between the two electrode terminals is applied. An extremely low voltage is introduced, and the residual energy is excited and released in the form of light through the combination of electrons and holes.

Different from ordinary incandescent bulbs, the LED, mini LED or micro LED has the advantages including the low power consumption, the long lifetime, no need for the warming time, the high response speed and the like, has the small volume, can withstand the vibration, is suitable for the mass production, and can be manufactured as an extremely small or array-type module according to the application requirements. So, the LED, mini LED or micro LED is widely applied to the illuminating apparatuses, indicators of information, communication, consumer electronic products, and backlight modules of display devices, and has become one of the most important elements in the daily life.

In the case of the light emitting device applied to the backlight module of the illuminating apparatus or the display device, the uniform light output and the slim property are always the targets pursued by the industry.

SUMMARY OF THE INVENTION

An objective of the invention is to provide a light emitting device and a manufacturing method thereof, and a display device having a backlight module using the light emitting device. The light emitting device, manufacturing method thereof and display device using the same according to the invention can have the uniform light output and the slim advantage.

To achieve the above-identified objective, the invention provides a light emitting device including a light-emitting unit, a structured light guide layer, a light guide unit and a patterned reflective layer. The light-emitting unit has a circuit substrate and multiple light emitting elements, and the light emitting elements are separately disposed on a surface of the circuit substrate. The structured light guide layer is disposed opposite the light-emitting unit. The structured light guide layer has multiple accommodating slots facing the surface and multiple light guide structures disposed between the two accommodating slots. Each accommodating slot is disposed in correspondence with each light emitting element. The structured light guide layer further has a bottom surface facing the surface and a top surface opposite to the bottom surface, and the light guide structures are disposed on the bottom surface. The light guide unit is disposed on the top surface of the structured light guide layer. The light guide unit has a light emitting surface opposite to the top surface. The patterned reflective layer has multiple reflective patterns disposed on the light emitting surface. Each reflective pattern is disposed in correspondence with each light emitting element.

To achieve the above-identified objective, the invention provides a manufacturing method of a light emitting device. The method includes: providing a light guide unit, and the light guide unit has a light emitting surface and a light input surface opposite to the light emitting surface; disposing a patterned reflective layer on the light guide unit, and the patterned reflective layer has multiple reflective patterns, the reflective patterns are disposed on the light emitting surface; disposing a structured light guide layer on the light input surface of the light guide unit, and the structured light guide layer has multiple accommodating slots disposed opposite the light input surface in a back-facing manner, and multiple light guide structures disposed between the two accommodating slots, the structured light guide layer further has a bottom surface disposed opposite the light input surface in a back-facing manner, and the light guide structures is disposed on the bottom surface; and disposing a light-emitting unit opposite the structured light guide layer, and the light-emitting unit has a circuit substrate and multiple light emitting elements, and the light emitting elements are separately disposed on a surface of the circuit substrate, the surface faces the bottom surface, and each light emitting element is disposed in correspondence with each accommodating slot and each reflective pattern.

In one embodiment, the light emitting elements extend from the surface into the accommodating slots.

In one embodiment, a gap is formed between the bottom surface of the structured light guide layer and the surface of the circuit substrate.

In one embodiment, the light guide structure is a microstructure.

In one embodiment, a material of the light guide unit is a glass or plastic material, and a material of the patterned reflective layer is a metal material.

In one embodiment, when viewed in a direction from a top of the light emitting surface to the light emitting device, an arrangement density of the reflective patterns corresponding to positions of the light emitting elements is greater than an arrangement density of the reflective patterns between the two light emitting elements.

In one embodiment, the light emitting device further includes an adhesive member, which is disposed in the accommodating slots, and adheres the structured light guide layer, the circuit substrate and the light emitting elements together.

In one embodiment, the light emitting device further includes a reflector disposed on the surface of the circuit substrate.

To achieve the above-identified objective, the invention further provides a display device including a display panel and a backlight module. The backlight module and the display panel are disposed opposite each other. The backlight module includes a light-emitting unit, a structured light guide layer, a light guide unit and a patterned reflective layer. The light-emitting unit has a circuit substrate and multiple light emitting elements, and the light emitting elements are separately disposed on a surface of the circuit substrate. The structured light guide layer is disposed opposite the light-emitting unit. The structured light guide layer has multiple accommodating slots facing the surface and multiple light guide structures disposed between the two accommodating slots. The structured light guide layer further has a bottom surface facing the surface and a top surface opposite to the bottom surface. Each accommodating slot is disposed in correspondence with each light emitting element, and the light guide structures are disposed on the bottom surface. The light guide unit is disposed on the top surface of the structured light guide layer. The light guide unit has a light emitting surface opposite to the top surface. The patterned reflective layer has multiple reflective patterns disposed on the light emitting surface, and each reflective pattern is disposed in correspondence with each light emitting element.

In one embodiment, when viewed in a direction from a top of the light emitting surface to the backlight module, an arrangement density of the reflective patterns corresponding to positions of the light emitting elements is greater than an arrangement density of the reflective patterns between the two light emitting elements.

In one embodiment, the backlight module further includes a first adhesive member, which is disposed in the accommodating slots and adheres the structured light guide layer, the circuit substrate and the light emitting element together.

In one embodiment, the backlight module further includes a reflector disposed on the surface of the circuit substrate.

In one embodiment, the display device further includes a second adhesive member, which is disposed on side surfaces of the display panel and the backlight module.

In one embodiment, the second adhesive member is a light-obstructing member.

As mentioned hereinabove, in the light emitting device, the manufacturing method thereof and the display device using the same according to the invention, the light emitting elements of the light-emitting unit are separately disposed on the surface of the circuit substrate. The structured light guide layer is disposed opposite the light-emitting unit, and has multiple accommodating slots and multiple light guide structures disposed between the two accommodating slots. Each accommodating slot is disposed in correspondence with each light emitting element, and the light guide structures are disposed on the bottom surface of the structured light guide layer. In addition, light guide unit is disposed on the top surface of the structured light guide layer, the patterned reflective layer has multiple reflective patterns disposed on the light emitting surface of the light guide unit, and each reflective pattern is disposed in correspondence with each light emitting element. With this structural design, the light emitting device, the manufacturing method thereof, and the display device having the light emitting device according to the invention have the uniform light output and the slim advantage.

DETAILED DESCRIPTION OF THE INVENTION

The light emitting device and the display device according to the preferred embodiment of present disclosure will be apparent from the following detailed description, which proceeds with reference to the accompanying drawings, and the same references relate to the same elements.

The light emitting device of the following embodiment has the uniform light output and the slim advantage, and can function as an illuminating apparatus or a bottom lighting backlight module of a liquid crystal display (LCD) device.

Figure 1:
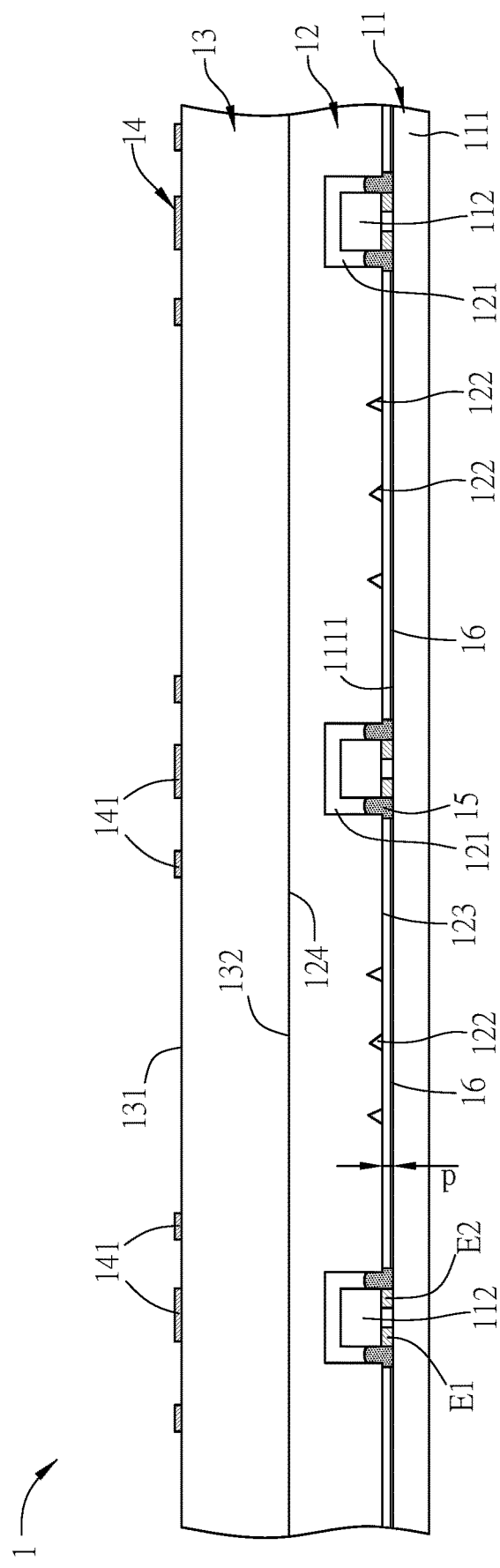
FIG. 1 is a schematic view showing a light emitting device according to an embodiment of the invention.

FIG. 1 is a schematic view showing a light emitting device according to an embodiment of the invention. Referring to FIG. 1, a light emitting device 1 includes a light-emitting unit 11, a structured light guide layer 12, a light guide unit 13 and a patterned reflective layer 14. In addition, the light emitting device 1 of this embodiment may further include an adhesive member 15 and a reflector 16.

The light-emitting unit 11 has a circuit substrate 111 and multiple light emitting elements 112, and the light emitting elements 112 are separately disposed on a surface 1111 of the circuit substrate 111. In some embodiments, the light emitting elements 112 may be disposed in an array on the circuit substrate 111. The circuit substrate 111 may be an active matrix (AM) type circuit substrate 111 or a passive matrix (PM) type circuit substrate, and may include a wire layer (not shown) disposed on a rigid substrate or a flexible substrate. The rigid substrate may be a glass substrate, a FR4 substrate, a metal substrate, a resin substrate or a composite substrate (e.g., metal core printed circuit board (MCPCB)), and the flexible substrate is flexible, and may include an organic polymeric material, for example, the glass transition temperature (Tg) of the organic polymeric material may range from 150 degrees Celsius to 600 degrees Celsius. The preferred temperature range may range from 300 degrees Celsius to 500 degrees Celsius. With such high glass transition temperature, the flexible substrate cannot damage or deteriorate to destroy its property upon the subsequent process. Herein, the organic polymeric material may be a thermal plastic material, such as but without limitation to polyimide (PI), polyethylene (PE), polyvinylchloride (PVC), polystyrene (PS), acrylic (propylene), fluoropolymer, polyester or nylon.

The light emitting element 112 may include an opto-electronic package body or an opto-electronic chip, and may include at least one LED, mini LED or micro LED, and may be disposed on the circuit substrate 111 by way of wire bonding or flip chip bonding and thus electrically connected with the traces of the circuit substrate 111. Thus, the light emitting elements 112 can be driven to emit light through the traces of the circuit substrate 111. Each light emitting element 112 of this embodiment is the opto-electronic package body, has two electrodes E1 and E2, and is disposed on the circuit substrate 111 by surface mount technology (SMT), and the corresponding electrodes of the circuit substrate 111 are not shown in FIG. 1. In some embodiments, the light emitting elements 112 may output a color light ray. In other embodiments, the light emitting elements 112 may output but without limitation to multiple kinds of color light rays. It is worth mentioning that for the light emitting diode serving as the light emitting element 112, the light emitting of the light emitting diode may be typically classified into front-side emitting (the light-emitting angle is small, and the luminance is high), and side-emitting (four side surfaces emit light) and five-side emitting (i.e., the front side and the four side surfaces emit light, and the light-emitting angle is large), and the preferred embodiment is the side-emitting making the emitted light become more uniform.

The structured light guide layer 12 is disposed opposite the light-emitting unit 11. The structured light guide layer 12 has a bottom surface 123 facing the surface 1111 of the circuit substrate 111 and a top surface 124 disposed opposite the bottom surface 123. In addition, the structured light guide layer 12 further has multiple accommodating slots 121 facing the surface 1111, and each accommodating slot 121 is disposed in correspondence with each light emitting element 112. The accommodating slot 121 of this embodiment is a recess, and the light emitting element 112 extends to the inside of the recess (accommodating slot 121) from the surface 1111 of the circuit substrate 111. Thus, the light ray outputted from the light emitting element 112 may enter the structured light guide layer 12 from the inner surface of the accommodating slot 121 including the peripheral side surfaces and the top surface.

In addition to the accommodating slot 121, the structured light guide layer 12 further has multiple light guide structures 122 disposed between the two accommodating slots 121. Herein, the light guide structures 122 are disposed on the bottom surface 123 of the structured light guide layer 12, and may be micro-structures, such as prisms, printed dots or other shapes of micro-structures. The light guide structure 122 may be depressed from the bottom surface 123 into the inner side of the structured light guide layer 12, or project beyond the bottom surface 123. In this example, the light guide structure 122 of this embodiment is the micro-structure depressed into the inside of the structured light guide layer 12. The light guide structure 122 may be manufactured by way of laser processing, hot pressing, coating, printing or bonding, and its cross-section shape may be, for example but without limitation to, the conical shape, arced shape, polygonal shape or other shapes, this disclosure is not limited thereto.

In the light emitting device 1 of this embodiment, the adhesive member 15 is disposed in the accommodating slots 121, so that the adhesive member 15 is adhered to the structured light guide layer 12, the circuit substrate 111 and the light emitting elements 112 to form a gap d (air is contained in gap d) between the bottom surface 123 of the structured light guide layer 12 and the surface 1111 of the circuit substrate 111. The structured light guide layer 12 for guiding travelling directions of the light rays outputted from the light emitting element 112 is made of a light-permeable material by way of transfer molding, coating, imprinting or other suitable methods. The light-permeable material may be resin including, for example but without limitation to, poly-methylmethacrylate (PMMA), polycarbonate (PC) or any other light-permeable material suitable for guiding light. The refractive index of the structured light guide layer 12 is greater than that of its peripheral substance (e.g., air having the refractive index equal to about 1). For the light ray with the specific angle, the total reflection effect is generated on the interfaces between the light guide structure 122 and the bottom surface 123 of the structured light guide layer 12 and the peripheral substance (the air in the gap d), so that the light rays outputted from the light emitting element 112 can be emitted from the top surface 124 of the structured light guide layer 12 and enter the light guide unit 13.

The light guide unit 13 is disposed on the top surface 124 of the structured light guide layer 12. The light guide unit 13 has a light emitting surface 131 opposite to the top surface 124 of the structured light guide layer 12, and a light input surface 132 opposite to the light emitting surface 131. Herein, the top surface 124 of the structured light guide layer 12 and the light input surface 132 of the light guide unit 13 are connected with each other. In some embodiments, an optical clear adhesive (OCA, not shown) may be used to adhere the light input surface 132 of the light guide unit 13 to the top surface 124 of the structured light guide layer 12, so that both of them are disposed in an overlapped manner to obtain the hybrid dual-light-guide structure and shorten the optical distance (OD) to achieve the slim objective. In some embodiments, for example, the thickness of the structured light guide layer 12 may be 0.2 mm, the thickness of the light guide unit 13 may be 0.7 mm, and the thickness of the hybrid dual-light-guide structure is about 1.0 mm. In addition, the material of the light guide unit 13 may be the glass or plastic material.

The patterned reflective layer 14 has multiple reflective patterns 141 disposed on the light emitting surface 131 of the light guide unit 13, and each reflective pattern 141 is disposed in correspondence with each light emitting element 112. The patterned reflective layer 14 may include an optical reflective material, which may include, for example, metal including, for example but without limitation to, aluminum, silver, chromium, nickel metal, or a combination thereof. The reflective pattern 141 is disposed in correspondence with the light emitting element 112, and can reflect the light rays, which are outputted from the light emitting element 112 and directly incident to the light emitting surface 131, back to the inside of the light guide unit 13, so that the luminance of the light emitting surface 131 corresponding to the position of the light emitting element 112 can be decreased (the local bright spot is avoided).

In addition, the reflector 16 is disposed on the surface 1111 of the circuit substrate 111. The reflector 16 can reflect the light rays emitted from the bottom surface 123 of the structured light guide layer 12 to the inside thereof to increase the light availability. The reflector 16 may be a reflective layer (e.g., metal coating) or a reflective sheet, and has a reflective material disposed on the surface 1111 of the circuit substrate 111 by way of electroplating, attaching, spraying or any other suitable method, for example. In this example, the reflector 16 is a reflective sheet. The reflector 16 may have the reflective material with the high reflective index, and the reflective material may include, for example but without limitation to, metal, metal oxide, highly reflective paint (white paint), mirror coating or a combination thereof. In a different and non-limitative embodiment, the reflector 16 may be omitted, and a reflective film is directly plated on the surface 1111 of the circuit substrate 111 to reflect the light rays. In some embodiments, the reflector 16 may be a single member and has multiple openings, and the light emitting element 112 may respectively pass through the openings and be disposed on the circuit substrate 111.

Figure 2:
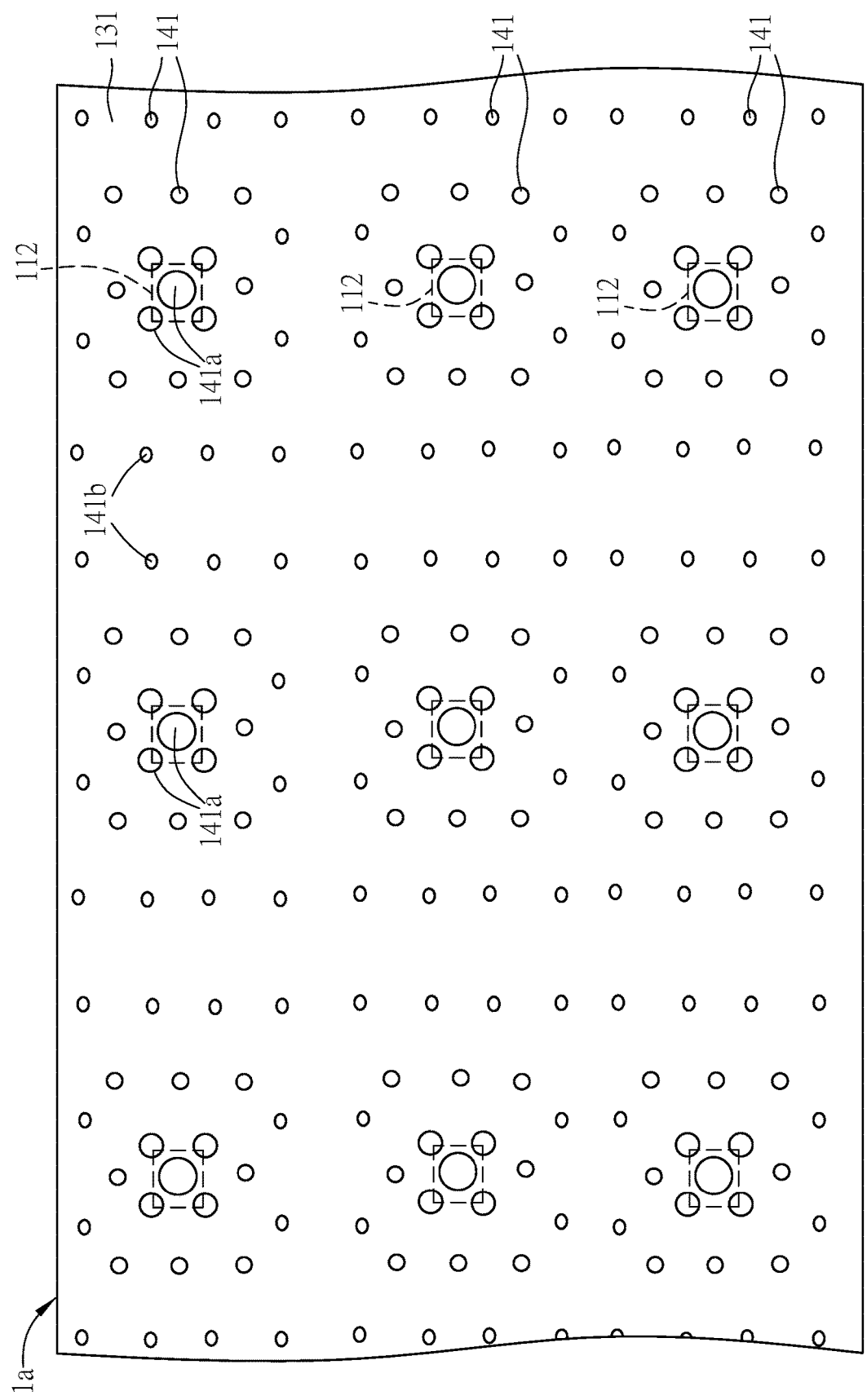
FIG. 2 is a schematic top view showing a light emitting device according to another embodiment of the invention.

FIG. 2 is a schematic top view showing a light emitting device 1a according to another embodiment of the invention. Referring to FIG. 2, the light emitting device 1a of this embodiment has all the elements of the light emitting device 1 and connection relationships therebetween. In addition, the light emitting device 1a of this embodiment differs from the light emitting device 1 in the following. When viewed in a direction from a top of the light emitting surface 131 to the light emitting device 1a, the arrangement density of the reflective patterns 141 corresponding to the positions of the light emitting elements 112 is greater than the arrangement density of the reflective patterns 141 between the two light emitting elements 112. Specifically speaking, as shown in FIG. 2, the light emitting device 1a of this embodiment also has reflective patterns 141a disposed at positions corresponding to the light emitting elements 112, and further has reflective patterns 141b disposed between the two light emitting elements 112, and the arrangement density of the reflective patterns 141a is greater than the arrangement density of the reflective patterns 141b. Thus, the local luminance perpendicularly facing the light emitting element 112 in the light emitting surface 131 can be decreased to make the light emitting device 1a have the more uniform light output.

Figure 3:
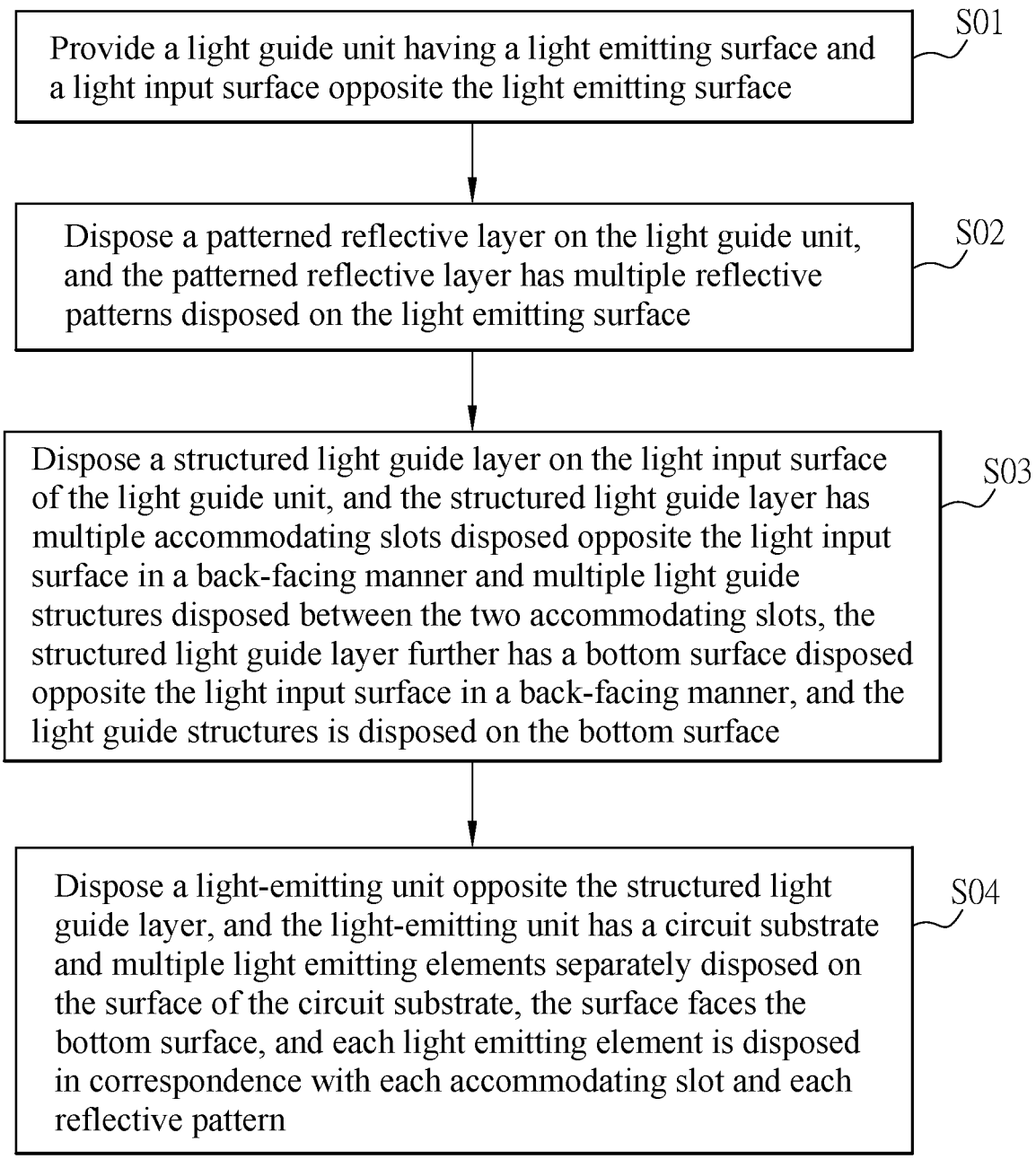
FIG. 3 is a flow chart showing steps in a manufacturing method of a light emitting device according to an embodiment of the invention.

The manufacturing method of the light emitting device of the invention will be explained with reference to FIGS. 1 and 3. FIG. 3 is a flow chart showing steps in the manufacturing method of the light emitting device according to an embodiment of the invention. Referring to FIG. 3, the manufacturing method of the light emitting device may include at least steps S01 to S04.

First, as shown in FIG. 1, the light guide unit 13 is provided. The light guide unit 13 has the light emitting surface 131 and the light input surface 132 opposite to the light emitting surface 131 (step S01). Next, the patterned reflective layer 14 is disposed on the light guide unit 13, and the patterned reflective layer 14 has multiple reflective patterns 141, and the reflective patterns 141 are disposed on the light emitting surface 131 (step S02). In some embodiments, the material of the light guide unit 13 may be glass. Because the glass is very smooth and has the high structural strength, the patterned reflective layer 14 made of the material, such as aluminum, can be easily disposed on the light emitting surface 131 of the light guide unit 13 by way of evaporating or sputtering. Then, the reflective patterns 141 are formed by photo-lithography processes, so that the processes of forming the patterned reflective layer 14 on the light guide unit 13 have the lower difficulty. In addition, as shown in FIG. 2, in some embodiments, when viewed in a direction from a top of the light emitting surface 131 to the light emitting device 1a, the arrangement density of the reflective patterns 141 corresponding to the positions of the light emitting elements 112 is greater than the arrangement density of the reflective patterns 141 between the two light emitting elements 112.

Thereafter, the structured light guide layer 12 is disposed on the light input surface 132 of the light guide unit 13, and the structured light guide layer 12 has multiple accommodating slots 121 disposed opposite the light input surface 132 in a back-facing manner, and multiple light guide structures 122 disposed between the two accommodating slots 121, and the structured light guide layer 12 further has the bottom surface 123 disposed opposite the light input surface 132 in a back-facing manner, and the light guide structures 122 is disposed on the bottom surface 123 (step S03). In some embodiments, for example, it is possible to dispose the light-permeable resin material on the light input surface 132 of the light guide unit 13 by way of transfer molding to form the structured light guide layer 12 having the accommodating slots 121 and the light guide structures 122.

Next, the light-emitting unit 11 is disposed opposite the structured light guide layer 12, and the light-emitting unit 11 has the circuit substrate 111 and multiple light emitting elements 112, the light emitting elements 112 are separately disposed on the surface 1111 of the circuit substrate 111, the surface 1111 faces the bottom surface 123, and each light emitting element 112 is disposed in correspondence with each accommodating slot 121 and each reflective pattern 141 (step S04). In the step S04, the light emitting elements 112 may extend from the surface 1111 of the circuit substrate 111 to the inside of the accommodating slot 121, and may be respectively disposed in correspondence with the reflective patterns 141. In addition, in the step S04, the gap d needs to be held between the bottom surface 123 of the structured light guide layer 12 and the surface 1111 of the circuit substrate 111 to facilitate the total reflection of light. In addition, in the step S04, it is further possible to dispose the adhesive member 15 inside the accommodating slots 121 to make the adhesive member 15 adhere the structured light guide layer 12, the circuit substrate 111 and the light emitting elements 112, so that the gap d is formed between the structured light guide layer 12 and the circuit substrate 111 disposed opposite each other.

In addition, the manufacturing method of the light emitting device may further include: disposing the reflector 16 on the surface 1111 of the circuit substrate 111 to reflect the light rays emitted from the bottom surface 123 of the structured light guide layer 12 to the inside of the structured light guide layer 12 to increase the light availability.

It is further reminded that the order of the steps S01 to S04 is only listed by way of example. In a different embodiment, the steps S01, S03 and S04 may be performed in order and then the step S02 is performed. Any other order of the steps may be adopted, and the invention is not restricted thereto.

In addition, other technical contents in the manufacturing method of the light emitting device have been described hereinabove, and detailed descriptions thereof will be omitted herein.

Figure 4:
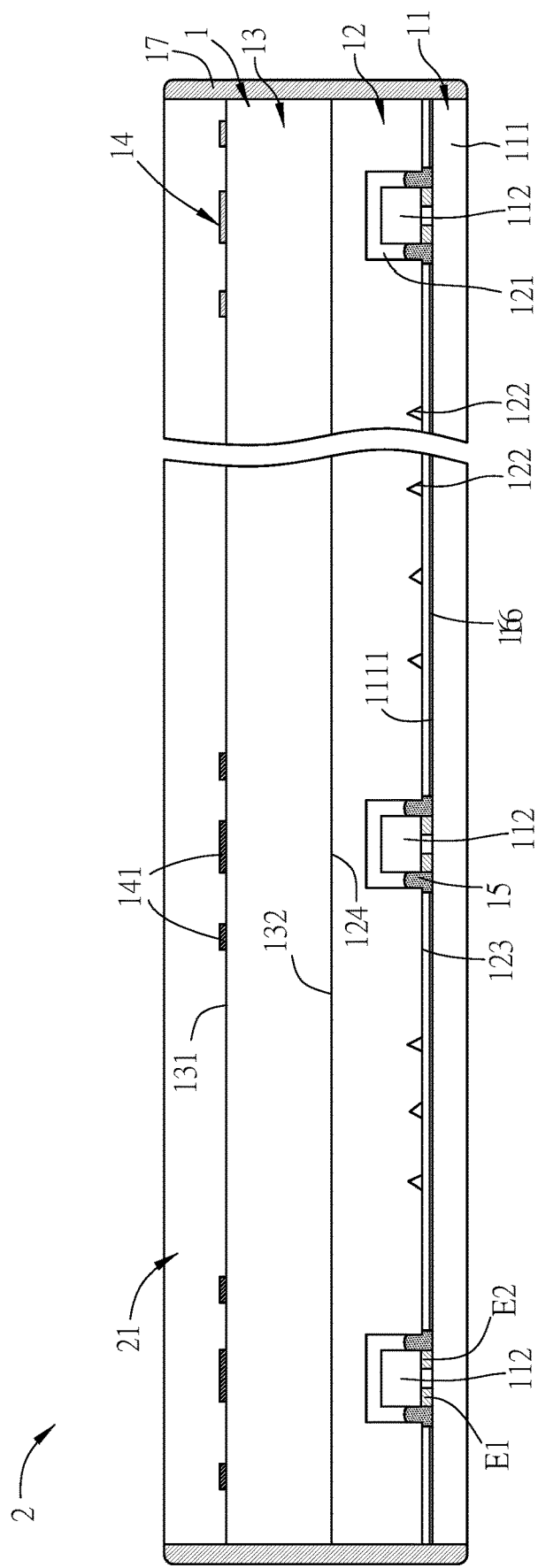
FIG. 4 is a schematic view of a display device according to an embodiment of the invention.
Figure 5:
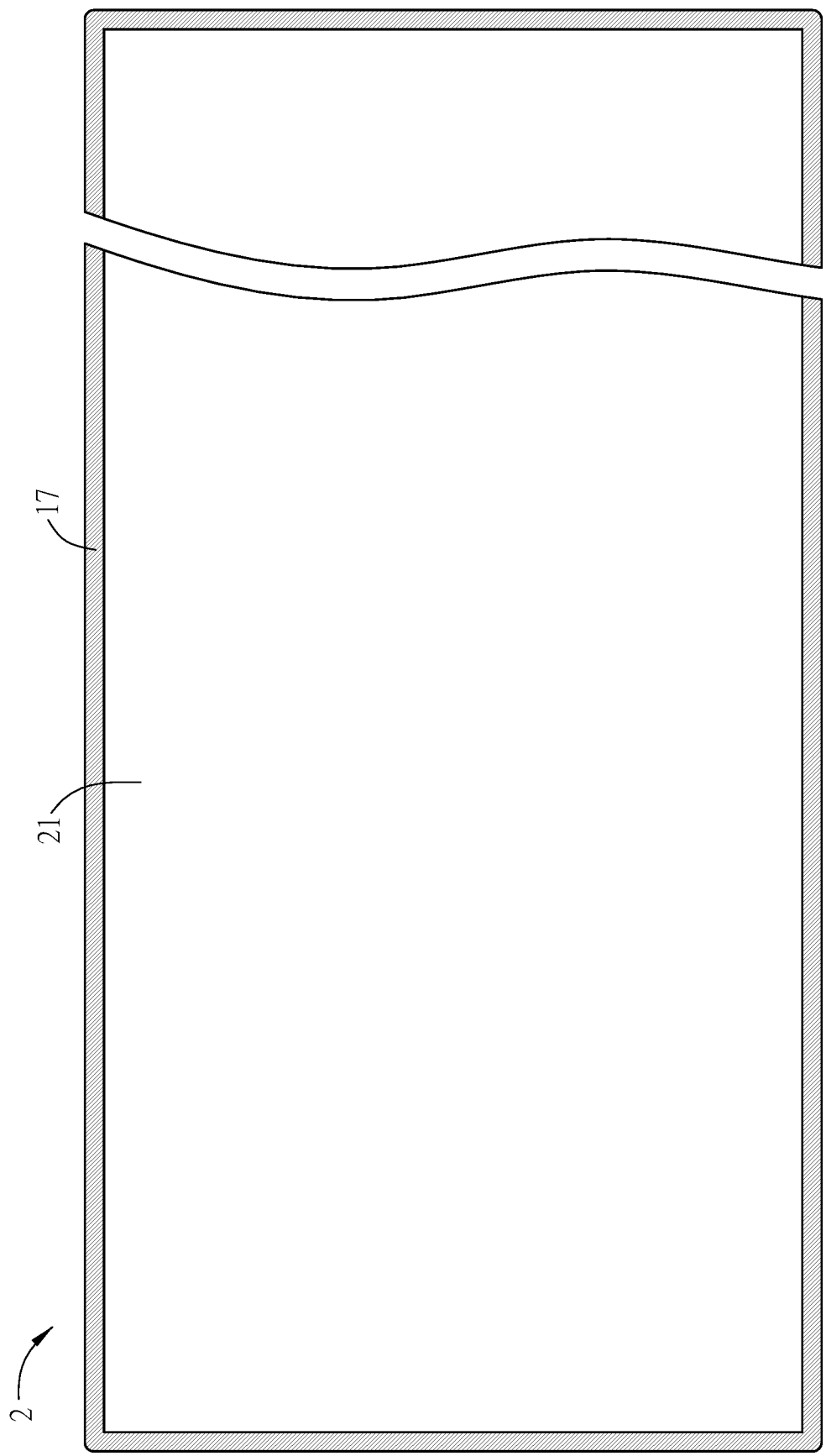
FIG. 5 is a schematic top view of the display device of FIG. 4.

FIG. 4 is a schematic view showing a display device 2 according to an embodiment of the invention, and FIG. 5 is a schematic top view showing the display device 2 of FIG. 4.

Referring to FIGS. 4 and 5, the display device 2 of this embodiment includes a display panel 21 and a backlight module, and the display panel 21 is disposed opposite the backlight module. In some embodiments, the display panel 21 may be, for example, a liquid crystal display panel, and the backlight module is a uniform surface light source for providing uniform light to the display panel 21, so that the display panel 21 can display an image. In this example, the light emitting device 1 functions as the backlight module of the display panel 21, and the bottom lighting backlight module is used. Thus, the light-emitting unit 11 of the light emitting device 1 (backlight module) can output light rays from the light emitting surface 131 of the light guide unit 13 to pass through the display panel 21, so that the display panel 21 displays the image. The light emitting device 1 (backlight module) may include the light-emitting unit 11, the structured light guide layer 12, the light guide unit 13 and the patterned reflective layer 14, and the technical contents thereof have been described hereinabove, and detailed descriptions thereof will be omitted. Of course, the light emitting device 1a may also function as the backlight module of the display panel 21, this disclosure is not limited thereto.

In some embodiments, at least one optical film (not shown) may further be disposed between the light emitting surface 131 of the light guide unit 13 and the display panel 21. The optical film includes, for example but without limitation to, the diffusion plate, 90° prism sheet, 0° prism sheet and brightness enhancement film. Accordingly, the light rays emitted from the light emitting surface 131 of the light guide unit 13 further pass through the optical film to form the more uniform surface light source.

In addition, the display device 2 of this embodiment may further include an adhesive member 17 (may be referred to as a second adhesive member), and the adhesive member 17 is disposed at on side surfaces of the display panel 21 and the backlight module (light emitting device 1). Herein, the adhesive member 17 is mounted on the peripheral side surfaces of the display panel 21 and the light emitting device 1 to fix the relative position between the display panel 21 and the light emitting device 1. In addition, the adhesive member 17 may also be the light-obstructing member, and may be a cured dark (e.g., black) adhesive glue. In addition to the adhesion of the display panel 21 to the light emitting device 1 to make the display device 2 have the sufficient structural strength, the adhesive member may further avoid the light leakage from the side surfaces of the display panel 21 and the light emitting device 1.

In some embodiments, the display panel 21 includes a thin film transistor substrate and a color filter substrate. The materials of the thin film transistor substrate and the color filter substrate include a glass material. If the materials of the light guide unit 13 of the light emitting device 1 and the circuit substrate 111 also include the glass material, then the display device 2 can have the higher structural strength, and the display panel 21, the light guide unit 13 and the circuit substrate 111 are free from deformation due to the generated heat after the long-term of use because the display panel 21, the light guide unit 13 and the circuit substrate 111 have the same coefficient of thermal expansion. Thus, the extremely narrow border can be used to carry the display device 2 (because the larger expansion-contraction space needs not to be left), so the display device 2 can be applied to the display with the extremely narrow border.

To sum up, in the light emitting device, the manufacturing method thereof and the display device using the same according to the invention, the light emitting elements of the light-emitting unit are separately disposed on the surface of the circuit substrate. The structured light guide layer is disposed opposite the light-emitting unit, and has multiple accommodating slots and multiple light guide structures disposed between the two accommodating slots. Each accommodating slot is disposed in correspondence with each light emitting element, and the light guide structures are disposed on the bottom surface of the structured light guide layer. In addition, light guide unit is disposed on the top surface of the structured light guide layer, the patterned reflective layer has multiple reflective patterns disposed on the light emitting surface of the light guide unit, and each reflective pattern is disposed in correspondence with each light emitting element. With this structural design, the light emitting device, the manufacturing method thereof, and the display device having the light emitting device according to the invention have the uniform light output and the slim advantage.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A light emitting device, including:
    a light-emitting unit having a circuit substrate and multiple light emitting elements, and the light emitting elements are separately disposed on a surface of the circuit substrate;
    a structured light guide layer disposed opposite the light-emitting unit, the structured light guide layer having multiple accommodating slots facing the surface and multiple light guide structures disposed between two of the accommodating slots, and each accommodating slot is disposed in correspondence with each light emitting element, and the structured light guide layer further has a bottom surface facing the surface and a top surface above the bottom surface, and the light guide structures are disposed on the bottom surface;
    a light guide unit disposed on the top surface of the structured light guide layer, the light guide unit has a light emitting surface above the top surface;
    an optical clear adhesive fully applied to the top surface of the structured light guide layer and a light input surface of the light guide unit; and
    a patterned reflective layer having multiple reflective patterns disposed on the light emitting surface, and each reflective pattern is disposed in correspondence with each light emitting element.

2. The light emitting device according to claim 1, wherein the light emitting elements extend from the surface into the accommodating slots.

3. The light emitting device according to claim 1, wherein a gap is formed between the bottom surface of the structured light guide layer and the surface of the circuit substrate.

4. The light emitting device according to claim 1, wherein each of the light guide structure is a micro-structure.

5. The light emitting device according to claim 1, wherein a material of the light guide unit is a glass or plastic material, and a material of the patterned reflective layer is a metal material.

6. The light emitting device according to claim 1, wherein when viewed in a direction from a top of the light emitting surface to the light emitting device, an arrangement density of the reflective patterns corresponding to positions of the light emitting elements is greater than an arrangement density of the reflective patterns between two of the light emitting elements.

7. The light emitting device according to claim 1, further including:
    an adhesive member disposed in the accommodating slots, and the adhesive member adheres the structured light guide layer, the circuit substrate and the light emitting elements together.

8. A manufacturing method of a light emitting device, including:
    providing a light guide unit, wherein the light guide unit has a light emitting surface and a light input surface below the light emitting surface;
    disposing a patterned reflective layer on the light guide unit, wherein the patterned reflective layer has multiple reflective patterns, the reflective patterns are disposed on the light emitting surface;
    disposing a structured light guide layer on the light input surface of the light guide unit, wherein the structured light guide layer has multiple accommodating slots disposed below the light input surface in a back-facing manner, and multiple light guide structures disposed between two of the accommodating slots, the structured light guide layer further has a bottom surface disposed below the light input surface in a back-facing manner, and the light guide structures are disposed on the bottom surface, an optical clear adhesive is fully applied to a top surface of the structured light guide layer and the light input surface of the light guide unit; and disposing a light-emitting unit opposite the structured light guide layer, wherein the light-emitting unit has a circuit substrate and multiple light emitting elements, and the light emitting elements are separately disposed on a surface of the circuit substrate, the surface faces the bottom surface, and each light emitting element is disposed in correspondence with each accommodating slot and each reflective pattern.

9. The manufacturing method according to claim 8, further including:
forming a gap between the bottom surface of the structured light guide layer and the surface of the circuit substrate.

10. The manufacturing method according to claim 8, further including:
extending the light emitting elements from the surface into the accommodating slots.

11. The manufacturing method according to claim 8, wherein when viewed in a direction from a top of the light emitting surface to the backlight module, an arrangement density of the reflective patterns corresponding to positions of the light emitting elements is greater than an arrangement density of the reflective patterns between the two light emitting elements.

12. The manufacturing method according to claim 8, further including:
disposing an adhesive member in the accommodating slots, and the adhesive member adheres the structured light guide layer, the circuit substrate and the light emitting elements together.

13. A display device, including:
a display panel;
and a backlight module, and the backlight module and the display panel are disposed opposite each other, and the backlight module includes:
a light-emitting unit having a circuit substrate and multiple light emitting elements, and the light emitting elements are separately disposed on a surface of the circuit substrate; a structured light guide layer disposed opposite the light-emitting unit, the structured light guide layer having multiple accommodating slots facing the surface and multiple light guide structures disposed between two of the accommodating slots, and the structured light guide layer further has a bottom surface facing the surface and a top surface above the bottom surface, and each accommodating slot is disposed in correspondence with each light emitting element, and the light guide structures are disposed on the bottom surface;
a light guide unit disposed on the top surface of the structured light guide layer, the light guide unit has a light emitting surface above the top surface;
an optical clear adhesive fully applied to the top surface of the structured light guide layer and a light input surface of the light guide unit; and
a patterned reflective layer having multiple reflective patterns disposed on the light emitting surface, and each reflective pattern is disposed in correspondence with each light emitting element.

14. The display device according to claim 13, wherein the light emitting elements extend from the surface into the accommodating slots.

15. The display device according to claim 13, wherein a gap is formed between the bottom surface of the structured light guide layer and the surface of the circuit substrate.

16. The display device according to claim 13, wherein each of the light guide structure is a micro-structure.

17. The display device according to claim 13, wherein a material of the light guide unit is a glass or plastic material, and a material of the patterned reflective layer is a metal material.

18. The display device according to claim 13, wherein when viewed in a direction from a top of the light emitting surface to the light emitting device, an arrangement density of the reflective patterns corresponding to positions of the light emitting elements is greater than an arrangement density of the reflective patterns between two of the light emitting elements.

19. The display device according to claim 13, wherein the backlight module further including:
a first adhesive member disposed in the accommodating slots, and the first adhesive member adheres the structured light guide layer, the circuit substrate and the light emitting elements together.

20. The display device according to claim 13, further including:
a second adhesive member disposed on side surfaces of the display panel and the backlight module.

* * * * *